United States Patent
Pels et al.

(10) Patent No.: US 6,858,793 B1
(45) Date of Patent: Feb. 22, 2005

(54) EMI-SUPPRESSION PLATE FOR USE IN IEEE-1394 APPLICATIONS

(75) Inventors: David J. Pels, Norwalk, CT (US); Viatcheslav Pronkine, Edgewater, NJ (US); Sean Patrick Ryan, Carmel, NY (US); Ronald C. Valenti, New Fairfield, CT (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 208 days.

(21) Appl. No.: 09/592,058

(22) Filed: Jun. 12, 2000

Related U.S. Application Data

(60) Provisional application No. 60/153,136, filed on Sep. 9, 1999.

(51) Int. Cl.[7] .................................................. H05K 9/00
(52) U.S. Cl. ......................... 174/35 C; 439/92; 439/95; 439/939
(58) Field of Search .............................. 174/35 R, 35 C; 361/816, 818; 439/92, 95, 101, 108, 607, 608, 620, 939

(56) References Cited

U.S. PATENT DOCUMENTS

| | | | | | |
|---|---|---|---|---|---|
| 4,772,221 A | * | 9/1988 | Kozlof | ........................ | 439/549 |
| 4,875,457 A | * | 10/1989 | Fitzner | ........................ | 123/633 |
| 4,930,200 A | * | 6/1990 | Brush, Jr. et al. | ........... | 29/25.42 |
| 5,151,054 A | * | 9/1992 | Briones et al. | ............. | 439/620 |
| 5,152,699 A | * | 10/1992 | Pfeifer | ........................ | 439/620 |
| 6,033,263 A | * | 3/2000 | Weidler et al. | ............. | 439/620 |

* cited by examiner

*Primary Examiner*—Dean A. Reichard
*Assistant Examiner*—Carmelo Oliva

(57) ABSTRACT

An EMI suppression plate surrounds a galvanically isolated connector at the opening in a chassis that is provided for the connector. The plate is configured to provide an immediate high frequency coupling to the chassis ground. The plate comprises a circuit board that includes two conductors that are coupled by one or more capacitors. One conductor is in contact with an outer shell of the connector, and the other conductor is in contact with the chassis ground. By providing a high frequency coupling between the connector and chassis at the location of the connector opening on the chassis, the ground current path between the connector and chassis ground is minimized.

20 Claims, 3 Drawing Sheets

EMI-SUPPRESSION PLATE FOR USE IN IEEE-1394 APPLICATIONS

This application claims the benefit of U.S. Provisional Application No. 60/153,136 filed 9 Sep. 1999.

BACKGROUND OF THE INVENTION

1. Field of the Invention

This invention relates to the field of electromagnetic interference, and in particular to a connector that suppresses electromagnetic interference from IEEE-1394 connectors.

2. Description of Related Art

The IEEE-1394 specification provides for a high speed interconnection among devices, and is particularly well suited for the high speed communication of video information among imaging devices, computers, recorders, and the like. An IEEE-1394 device operates at a bit rate of up to 400 megabits per second (higher bit rates are possible), with sharp rise and fall times. This high speed switching results in radiated emissions well into the gigahertz range. These emissions are particularly prominent at connectors, due to the relatively higher impedance introduced by the connection of pins carrying the high frequency signals.

FIG. 1 illustrates an example technique for suppressing electromagnetic interference at a connector 130 using conventional prior art techniques. Illustrated in FIG. 1 is a printed circuit board (PCB) 120 that is mounted within a chassis 110. The chassis 110 is conductive, and forms a reference ground potential 101. The connector 130 has a conductive outer shell that serves to reduce electromagnetic emissions from the pins or receptacles within the connector 130 that serve to connect external signals to components 125 on the PCB 120. The IEEE-1394 specification requires that the outer shell of the connector 130 be galvanically isolated from the reference ground potential 101. The opening 112 in the chassis 110 for the connector 130 is configured to maintain a separation between the outer shell of the connector 130 and the chassis 110. To provide the desired shielding of high-frequency electromagnetic emissions, the outer shell of the connector 130 is coupled to the chassis 110 via one or more capacitors 160. As illustrated in FIG. 1, when a cable (not shown) that is carrying the high frequency signals to the printed circuit board 120 is connected via the connector 130, a ground current path 105 is formed that travels through the outer shell of the connector 130, through a conductor 121 on the printed circuit board 120, through the capacitor 160 to a ground conductor 122 on the printed circuit board 120, and thereafter through a coupling of the conductor 122 to the chassis 110, and back along the cable.

At the very high frequencies of IEEE-1394 communications, millimeters of ground path substantially reduce the effectiveness of the connectors' electromagnetic shielding.

BRIEF SUMMARY OF THE INVENTION

It is an object of this invention to reduce the ground current path of a galvanically isolated connector, such as an IEEE-1394 connector.

This object, and others, is achieved by providing an EMI suppression plate that surrounds a galvanically isolated connector at the opening in a chassis that is provided for the connector. The plate is configured to provide an immediate high frequency coupling to the chassis ground. The plate comprises a circuit board that includes two conductors that are coupled by one or more capacitors. One conductor is in contact with an outer shell of the connector, and the other conductor is in contact with the chassis ground. By providing a high frequency coupling between the connector and chassis at the location of the connector opening on the chassis, the ground current path between the connector and chassis ground is minimized.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 1:
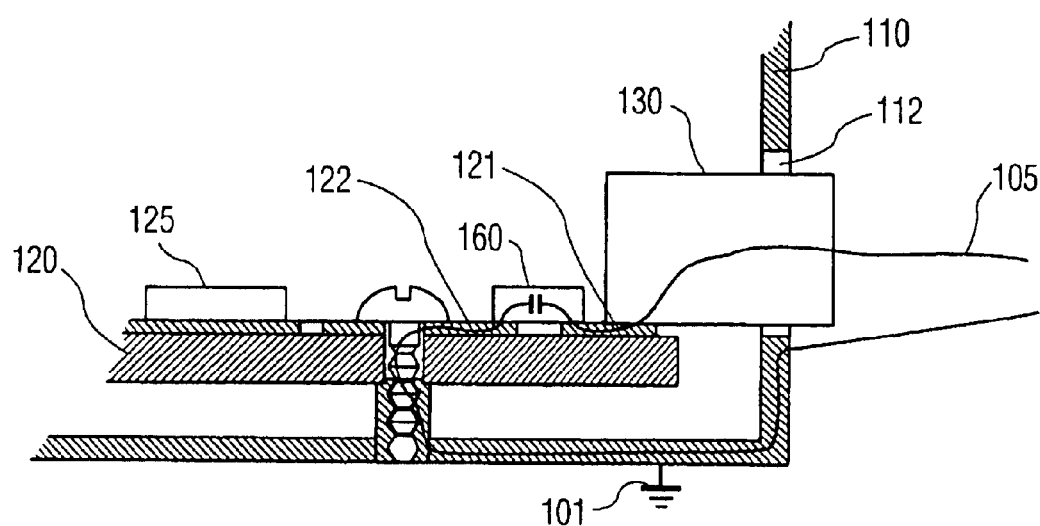
FIG. 1 illustrates an example assembly for suppressing electromagnetic interference at a connector using conventional prior art techniques.
Figure 2:
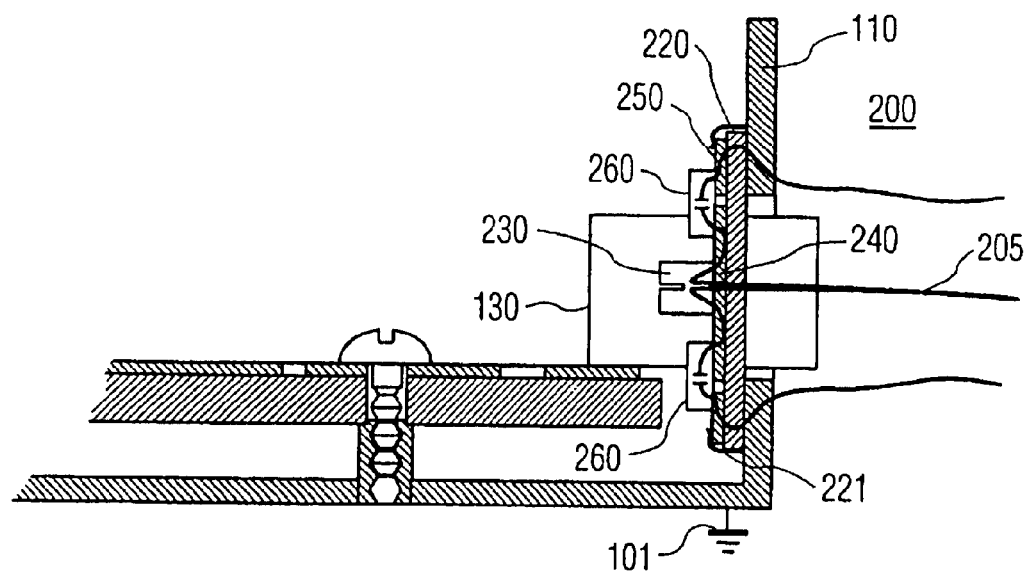
FIG. 2 illustrates an example assembly for suppressing electromagnetic interference at a connector in accordance with this invention.
Figure 3:
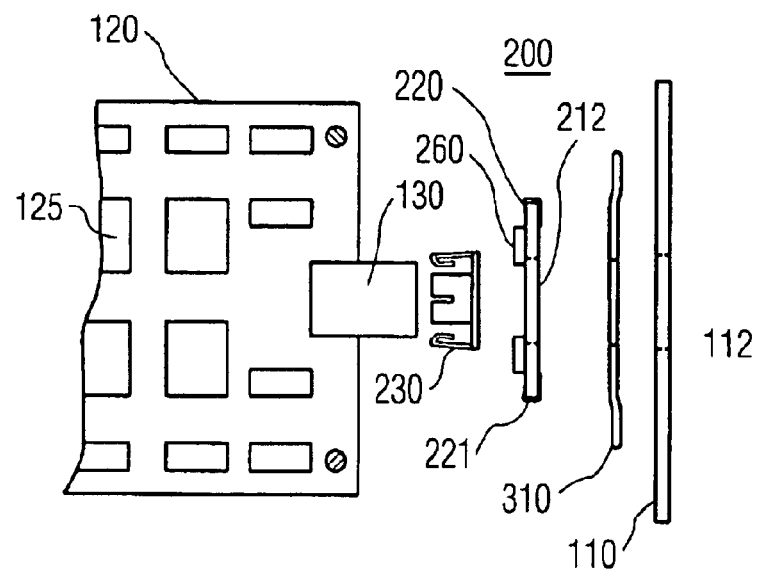
FIG. 3 is an alternative view of the example assembly for suppressing electromagnetic interference at a connector in accordance with this invention.

FIGS. 2 and 3 illustrate views of an example assembly for suppressing electromagnetic interference at a connector 130 in accordance with this invention. An EMI suppression plate 200 surrounds the connector 130 at the opening 112 of the chassis 110 that is provided for the connector 130. The EMI suppression plate 200 includes a printed circuit board 220, and one or more contact items 230 that connect a conductor 240 of the printed circuit board 220 to the conductive outer shell of the connector 130. A second conductor 250 on the printed circuit board 220 is connected to the chassis 110, preferably via EMI clips and gaskets, common in the art. The first 240 and second 250 conductors are electrically coupled via one or more capacitors 260, thereby providing a high frequency current path from the outer shell of the connector 130 to the chassis ground 101, at the egress area of the connector 130. As illustrated by the ground current path 205, the placement of the EMI suppression plate 200 at the egress area provides a minimal length path, particularly in comparison to the conventional shielding technique illustrated in FIG. 1. It is also noted that if the coupling to the shielded connector is somewhat symmetric, some cancellation effects will occur, thereby further reducing the EMI emissions from the connector 130.

Figure 4:
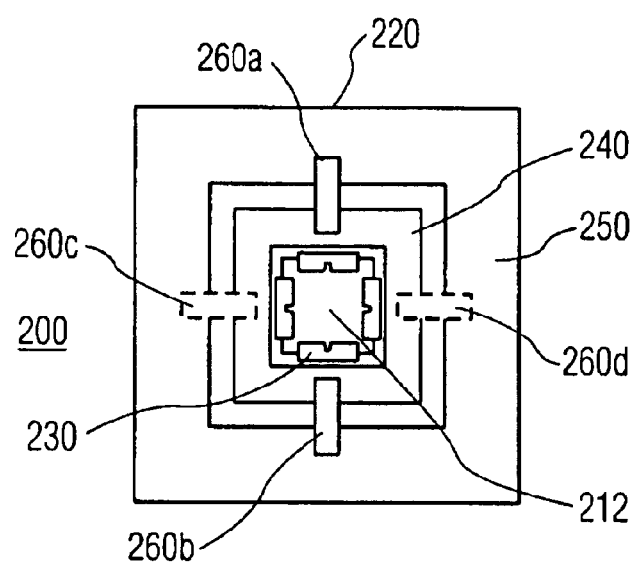
FIG. 4 is an example EMI suppression plate in accordance with this invention.

FIG. 3 illustrates an arrangement of parts for the suppression plate 200. In this embodiment, the contact item 230 is a set of resilient wipers, or contact fingers, preferably a beryllium-copper or steel alloy. These resilient wipers 230 are formed so as to be tensioned against the conductive outer shell of the connector 130 when the connector 130 is inserted through the suppression plate 200. The resilient wipers 230 are mounted on the circuit board 220 to provide contact between the conductive outer shell of the connector 130 and the one or more capacitors 260, as illustrated in FIG. 4. The circuit board 220 includes an opening 212 through which the connector 130 passes, and about which the resilient wipers 230 are placed. The resilient wipers 230 are connected to the conductor 240 on the printed circuit board 220, typically via a soldering operation. The capacitors 260a, 260b, and optionally others 260c, 260d, etc., couple the conductor 240 to conductor 250 on the printed circuit board 220. The conductor 250 is electrically coupled to the chassis 110 via clips 221. Illustrated in FIG. 3 is an optional contact plate 310 that is configured to provide a low impedance path to the chassis 110 by maximizing the contact area about the opening 112 in the chassis 110.

Figure 5:
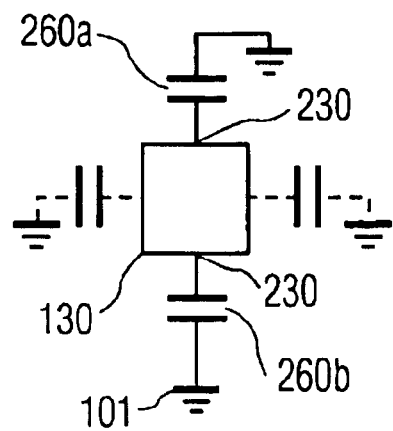
FIG. 5 is a circuit diagram corresponding to the example EMI suppression plate in accordance with this invention.

FIG. 5 is a circuit diagram corresponding to the example EMI suppression plate in accordance with this invention. As illustrated, multiple high-frequency paths to chassis ground 101 can be provided by using multiple capacitors 260a, b, c, d, etc.

The foregoing merely illustrates the principles of the invention. It will thus be appreciated that those skilled in the art will be able to devise various arrangements which, although not explicitly described or shown herein, embody the principles of the invention and are thus within its spirit and scope. For example, the suppression plate 200 can be configured to be integral to the connector 130. By incorporating the printed circuit board 220 and the capacitors 260 into a connector 130, the resilient wipers 230 can be replaced by a simple solder connection between the conductor 240 and the outer shell of the connector 130. Note also that the term "printed circuit board" can include a variety of embodiments, including rigid, semi-rigid, flexible printed circuits, and the like. Other means of providing an AC contact between the EMI suppression plate 200 and the outer shell of the connector 130, and a DC contact between the EMI suppression plate 200 and the chassis 110 in the vicinity of the opening 112 of the chassis 110, will be evident to one of ordinary skill in the art in view of this disclosure.

Figure 6:
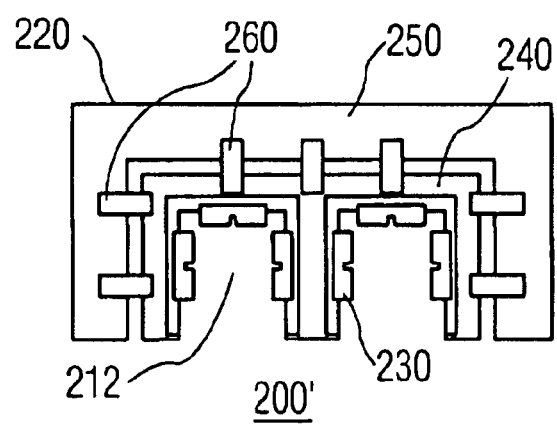
FIG. 6 is an example alternative EMI suppression plate in accordance with this invention.

Note also that the figures are presented for illustrative purposes, and are not intended to limit the scope of this invention to the examples shown. If the connector 130, for example, does not have the uniform cross section area shown, alternative arrangements of the EMI suppression plate 200 can be embodied to facilitate a connection to the conductive outer shell of the connector 130. FIG. 6, for example, illustrates an embodiment 200' that provides EMI suppression for two connectors. Note that in this embodiment 200', the EMI suppression plate is configured to envelop the connectors on three sides, only. This configuration is particularly well suited to accommodate connectors 130 that have flanges and similar protrusions that prevent a direct passage of the connector 130 through a closed opening in the EMI suppression plate. In this embodiment, the EMI suppression plate is slipped over the connector beyond the flange or other protrusion. These and other system configuration and optimization features will be evident to one of ordinary skill in the art in view of this disclosure, and are included within the scope of the following claims.

We claim:

1. An electronic assembly comprising:
   a chassis that is configured to provide a chassis ground, the chassis having a surface with an opening for receiving a connector,
   a first circuit board that includes the connector, the connector having:
     a conductive outer shell, and
     one or more receptacles for receiving signals that are coupled to components on the first circuit board, and
   a suppression plate that is configured to provide a galvanically isolated high frequency coupling between the conductive outer shell of the connector and the chassis in proximity to the opening of the chassis that receives the connector, wherein the suppression plate includes a second circuit board including a first conductor electrically coupled to the outer shell and a second conductor electrically coupled to the chassis ground, wherein the first conductor and the second conductor are mounted on a first side of the second circuit board.

2. The electronic assembly of claim 1, wherein the suppression plate envelops the connector on at least three sides.

3. The electronic assembly of claim 1, wherein the suppression plate is integral with the connector.

4. The electronic assembly of claim 1, wherein the second circuit board includes:
   one or more contact items that provide electrical contact between the conductive outer shell of the connector and the first conductor on the second circuit board, and
   one or more capacitors that are configured to couple high frequency signals from the first conductor on the second circuit board to the second conductor on the second circuit board that is electrically coupled to the chassis ground,
   thereby providing galvanic isolation between the outer shell of the connector and the chassis ground while also providing a high frequency coupling between the outer shell of the connector and the chassis ground.

5. The electronic assembly of claim 4, wherein:
   the connector is mounted on the first circuit board so as to protrude through the opening, without contact with the chassis, when the first circuit board is appropriately mounted in the chassis, and
   the second circuit board is mounted on the surface of the chassis coincident with the opening.

6. The electronic assembly of claim 4, wherein at least two of the one or more capacitors are configured on the second circuit board so as to provide a symmetric path for the high frequency signals to the chassis ground.

7. The electronic assembly of claim 4, wherein at least one of the one or more contact items comprise a resilient conductor that provides the electric contact between the conductive outer shell of the connector and the first conductor on the second circuit board via a contact tension caused by a distortion of the resilient conductor from a non-stressed orientation of the resilient conductor.

8. The electronic assembly of claim 4, wherein at least one of the one or more contact items comprises a resilient conductor comprising at least one of: beryllium-copper and steel.

9. The electronic assembly of claim 1, wherein the first circuit board and the suppression plate comprise at least one of:
   a rigid circuit configuration,
   a semi-rigid circuit configuration, and
   a flexible circuit configuration.

10. A method of manufacturing an electronic assembly comprising:
   providing a chassis that is configured to provide a chassis ground,
     the chassis having a surface with an opening for receiving a connector, providing a first circuit board that includes the connector, the connector having:
- a conductive outer shell, and
- one or more receptacles for receiving signals that are coupled to components on the first circuit board, and providing a suppression plate that is configured to provide a galvanically isolated high frequency coupling between the conductive outer shell of the connector and the chassis in proximity to the opening of the chassis that receives the connector when the first circuit board and the suppression plate are attached to the chassis, wherein the suppression plate includes a second circuit board including a first conductor electrically coupled to the outer shell and a second conductor electrically coupled to the chassis ground, wherein the first conductor and the second conductor are mounted on a first side of the second circuit board.

11. The method of claim 10, wherein the suppression plate being integral with connector on the first circuit board.

12. The method of claim 10, wherein the second circuit board includes:
- one or more contact items that are configured to provide electrical contact between the conductive outer shell of the connector and the first conductor on the second circuit board when the first circuit board and the second circuit board are affixed to the chassis, and
- one or more capacitors that are configured to couple high frequency signals from the first conductor on the second circuit board to the second conductor on the second circuit board that is electrically coupled to the chassis ground when the suppression plate is attached to the chassis.

13. The method of claim 12, further including mounting the connector on the first circuit board so as to protrude through the opening, without contact with the chassis, when the first circuit board is attached to the chassis, and wherein the suppression plate is attached to the surface of the chassis coincident with the opening.

14. The method of claim 12, wherein at least one of the one or more contact items comprise a resilient conductor that provides the electric contact between the conductive outer shell of the connector and the first conductor on the second circuit board via a contact tension caused by a distortion of the resilient conductor from a non-stressed orientation of the resilient conductor when the first circuit board and the second circuit board are affixed to the chassis.

15. An EMI suppression plate comprising:

a circuit board that includes:
- one or more contact items that provide electrical contact between a conductive outer shell of a connector and a first conductor on the circuit board, and
- one or more capacitors that are configured to couple high frequency signals from the first conductor on the circuit board to a second conductor on the circuit board that is configured to become electrically coupled to a chassis ground when the EMI suppression plate is attached to a chassis, wherein the first conductor and the second conductor are mounted on a first side of the circuit board, thereby providing galvanic isolation between the outer shell of the connector and the chassis ground while also providing a high frequency coupling between the outer shell of the conductor and the chassis ground.

16. The EMI suppression plate of claim 15, wherein:

the circuit board is mounted on the surface of the chassis coincident with an opening in the chassis that is configured to receive the connector.

17. The EMI suppression plate of claim 15, wherein:

at least two of the one or more capacitors are configured on the circuit board so as to provide a symmetric path for the high frequency signals to the chassis ground.

18. The EMI suppression plate of claim 15, wherein at least one of the one or more contact items comprise a resilient conductor that provides the electric contact between the conductive outer shell of the connector and the first conductor on the circuit board via a contact tension caused by a distortion of the resilient conductor from a non-stressed orientation of the resilient conductor.

19. The EMI suppression plate of claim 15, wherein at least one of the one or more contact items comprises a resilient conductor comprising at least one of: beryllium-copper and steel.

20. The EMI suppression plate of claim 15, wherein the circuit board comprises at least one of:
- a rigid circuit configuration,
- a semi-rigid circuit configuration, and
- a flexible circuit configuration.

* * * * *